US006019654A

United States Patent [19]
Kim

[11] Patent Number: 6,019,654
[45] Date of Patent: Feb. 1, 2000

[54] MULTI-COLOR ORGANIC EL DISPLAY ARRAY PANEL AND METHOD FOR FABRICATING THE SAME

[75] Inventor: Sung Tae Kim, Seoul, Rep. of Korea

[73] Assignee: LG Electronics Inc., Seoul, Rep. of Korea

[21] Appl. No.: 09/050,061

[22] Filed: Mar. 30, 1998

[30] Foreign Application Priority Data

Apr. 24, 1997 [KR] Rep. of Korea ............ 97-15439

[51] Int. Cl.[7] .................................................. H05B 33/02
[52] U.S. Cl. ........................................................ 445/24
[58] Field of Search ..................................... 445/24; 313/505

[56] References Cited

U.S. PATENT DOCUMENTS

| | | |
|---|---|---|
| 4,006,383 | 2/1977 | Lou et al. ............... 313/505 |
| 5,294,870 | 3/1994 | Tang et al. .............. 313/505 |
| 5,445,899 | 8/1995 | Budzilek et al. ......... 313/505 |

*Primary Examiner*—Kenneth J. Ramsey
*Attorney, Agent, or Firm*—Fleshner & Kim

[57] ABSTRACT

A multi-color EL display panel and a method for fabricating the same are disclosed, the panel including a transparent support, a plurality of fluorescent media on the transparent support, partition walls between the fluorescent media, a first electrode on each of the fluorescent media, a planar electroluminescent layer on the first electrodes, second electrode stripes on the electroluminescent layer, and a protective layer on the second electrode elements, whereby minimizing the color contamination and improving the spatial uniformity of luminance.

10 Claims, 2 Drawing Sheets

MULTI-COLOR ORGANIC EL DISPLAY ARRAY PANEL AND METHOD FOR FABRICATING THE SAME

BACKGROUND OF THE INVENTION

1. Field of the Invention

The present invention relates to organic electroluminescent (EL) displays, and more specifically, to a multi-color EL display array panel and a method for fabricating the same.

2. Discussion of the Related Art

Organic EL devices, also called organic light emitting diodes (LEDs), are becoming very popular because of their possible application to flat panel displays (FPDs). They are extremely thin, matrix-addressable and can be operated at a relatively low voltage, typically less than 15 volts. Furthermore, they have additional characteristics suitable for next generation FPDs such as little dependence on viewing angle and good device-formability on flexible substrates among other things. Organic LEDs differ fundamentally from conventional inorganic LEDs. While the charge transfer in inorganics is band-like in nature and the electron-hole recombination results in the interband emission of light, organic films are generally characterized by the low-mobility activated hopping transport and the emission is excitonic. Organic EL devices are also substantially different from conventional inorganic EL devices, especially in that organic EL devices can be operated at low DC voltages.

A substantial amount of research has been directed toward the efficiency improvement and color control of organic LEDs. The efficiency of some organic EL devices has now been demonstrated to be close to its theoretical limit and certainly adequate for many commercial applications. Moreover, the color control is probably not limiting for many potential applications such as monochromatic and simple multi-color displays. However, it would be more difficult to generate complex multi-color and full color displays. There are several ways of full color generation. First, one may form pixels of red(R), green (G), blue(B) by separately depositing the light emitting layer of each pixel. Secondly, one can generate R, G & B by passing white light through a set of R,G,B color filters. Finally, one can obtain R, G & B by passing blue light through color changing media as described in U.S. Pat. No. 5,126,214. A similar scheme has been devised by C. Tang et al. in U.S. Pat. No. 5,294,870, and the device structure suggested therein is described in FIG. 1.

Referring now to FIG. 1, illustrated therein is a cross-sectional side view of several sub-pixels in a multi-color EL display panel. This background art multi-color EL display array panel may be fabricated by the following process. An array of patterned fluorescent medium G and another medium R (2 in FIG. 1) are formed on top of a transparent support 1. Following the formation of first electrode stripes 3 on a planarizing layer 7, an array of parallel walls 6 has been prepared to laterally separate each sub-pixel element. Then the organic EL layer 4 is formed using a conventional deposition technique. To insure lateral separation of each sub-pixel, next, the deposition of second electrode elements 5 is performed in such a manner that the direction of traveling metallic vapor forms an angle θ with the normal of the deposition surface. The use of conventional pixellation technique is precluded due to the nature of organic materials which are extremely vulnerable to the damage by most solvents. That is why they resorted to a rather complicate patterning method utilizing a shadowing effect. The idea of separating each stripe of the second electrode by the deposition at an oblique angle may be conceivable, but is not suitable at all for mass productions. First of all, it is impossible to have a vapor source which may set the direction of traveling metallic vapor at a constant angle θ with the surface normal over the whole panel surface. Whether one has either a point source or a large area source, the angle θ would vary with the position of pixel on the transparent support 1 because of the diverging nature of vapor. One may be able to obtain a certain degree of separation with a complicate arrangement of source and support, but only at the sacrifice of production yield. Finally, a protective film 8 is formed, as seen in FIG. 1.

In summary, the background art described above has the following problems.

First, R,G,B from adjacent sub-pixels can be easily mixed, resulting in the color contamination by neighboring sub-pixels because of having no optical barriers between the fluorescent media 2.

Secondly, the suggested method to separate the electroluminescent layer and the second electrode element of a sub-pixel from those of another sub-pixel is not suitable for mass productions.

SUMMARY OF THE INVENTION

Accordingly, it is an object of this invention to obviate one or more of the problems due to the limitations and disadvantages of the related art.

It is another object of this invention to provide a structure of the multi-color ELD array panel and a method for fabricating the same, which can minimize the color contamination.

It is further object of the present invention is to provide a structure of the multi-color ELD array panel and a method for fabricating the same, which simplifies the fabrication process and allows an easy control of the fabrication process.

Further object of this invention is to provide a multi-color ELD array panel and a method for fabricating the same, which makes possible significantly lowering the electrical resistance of the first electrode elements and thereby insures uniform luminance all over the panel surface.

Additional features and advantages of the invention will be set forth in the description which follows, and in part will be apparent from the description, or may be learned by the practice of the invention. The objectives and other advantages of the invention will be realized and attained by the structure, particularly pointed out in the written description and claims hereof as well as the appended drawing.

To achieve these and other advantages in accordance with the purpose of the present invention, as embodied and broadly described, the multi-color ELD array panel includes a transparent support, a plurality of fluorescent media on the transparent support, an array of partition walls separating each fluorescent medium, a planarizing layer on the fluorescent media, an array of first electrode stripes on the planarizing layer, a planar electroluminescent layer on the first electrode elements, an array of second electrode stripes on the electroluminescent layer, and a protective layer on the second electrode elements.

The partition walls are formed of any electrically conductive material selected from metals such as gold, silver, copper and aluminum, or alloys of them, and they serve as auxiliary electrode elements as well as a means to physically separate each of the fluorescent media for the purpose of minimizing the color contamination..

It is to be understood that both the foregoing general description and the following detailed description are exemplary and explanatory, and are intended to provide further explanation of the invention as claimed.

BRIEF DESCRIPTION OF THE DRAWINGS

The accompanying drawings, which are included to provide further understanding of the invention and constitute a part of this specification, illustrate embodiments of the invention and together with the description serve to explain the principles of the invention.

In the drawings.

DETAILED DESCRIPTION OF THE PREFERRED EMBODIMENT

Figure 1:
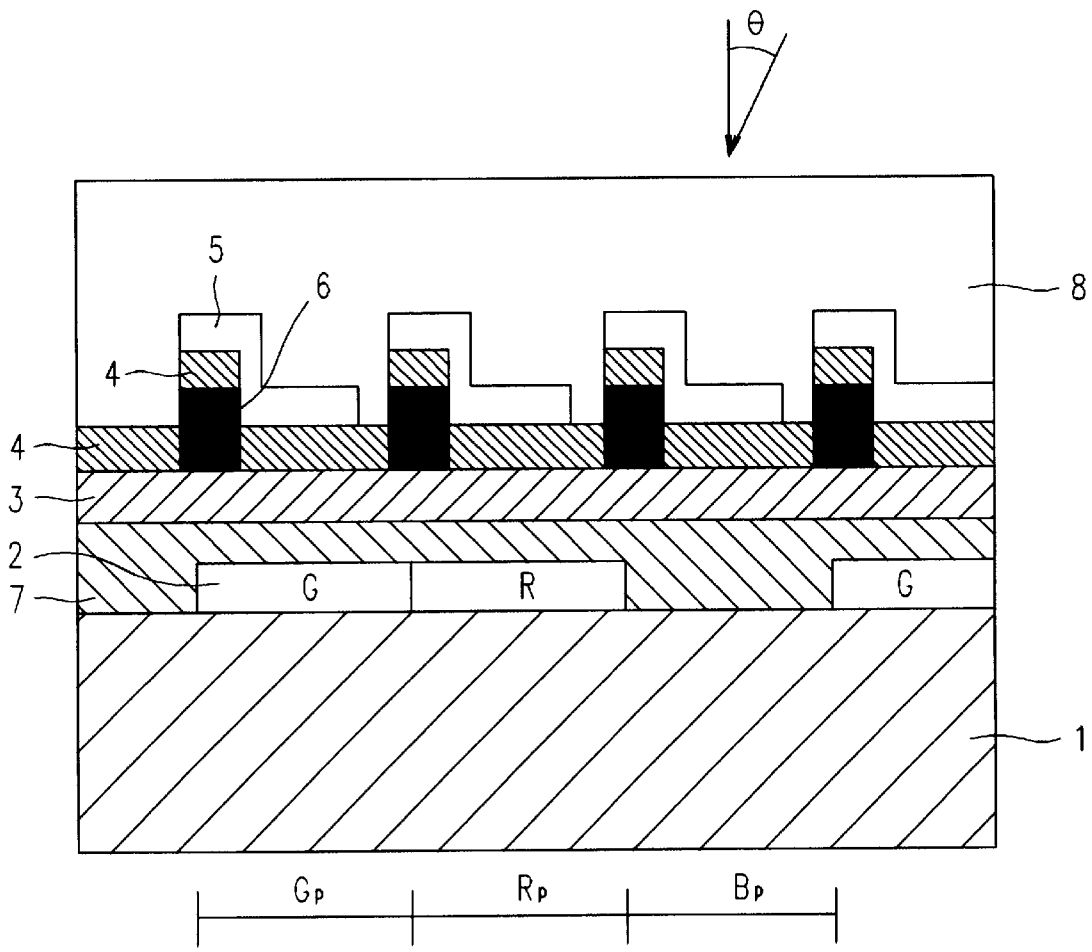
FIG. 1 illustrates a cross-sectional view of a background art multi-color ELD array panel; and, FIG. 2 illustrates a cross-sectional view of a multi-color ELD array panel in accordance with a preferred embodiment of the present invention.
Figure 2:
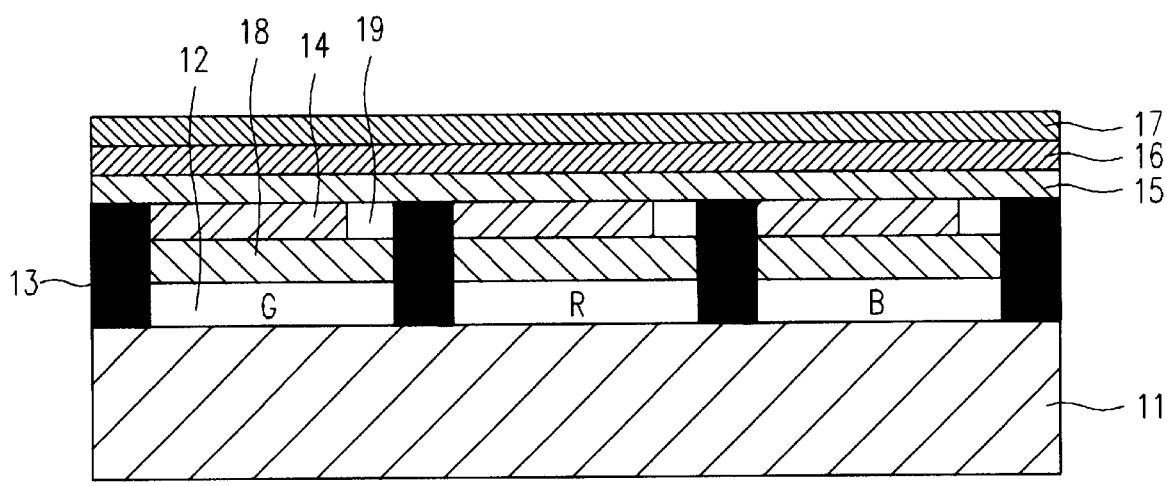

Reference will now be made in detail to the preferred embodiments of the present invention, an example of which is illustrated in the accompanying drawing. FIG. 2 illustrates a cross-sectional view of a multi-color ELD array panel in accordance with a preferred embodiment of the present invention which has basically a simple XY matrix structure with a plurality of first and second electrode stripes intersecting each other in 90 degree.

Referring to FIG. 2, the multi-color ELD array panel includes a plurality of fluorescent media 12 of red, green and blue colors formed on a transparent support 11, an array of partition walls 13 made of a conductive material between the fluorescent media 12, and first electrode stripes 14 connected to the partition walls 13 and formed over the fluorescent media 12, together with an electroluminescent layer 15, second electrode stripes 16 and a protective layer 17.

The aforementioned multi-color ELD array panel of the present invention may be fabricated by the following process.

First, a fluorescent medium layer 12 is formed on a transparent support 11 to a thickness of approx. 10 nm~2000 nm using a physical vapor deposition method such as thermal evaporation, e-beam deposition, sputter deposition and ionized cluster beam deposition, a chemical vapor deposition technique, or a wet process such as spin coating, dipping, Doctor blade method and the like. A series of film forming and patterning steps needs to be performed to prepare the fluorescent media for three different colors. Then, a planarizing layer 18 and an insulating layer 19 are successively spun from an insulating material such as polyimide and benzocyclobutene on the fluorescent medium layer 12 to a thickness of approx. 5 nm~1000 nm and 50 nm~200 nm, respectively. The planarizing layer 18 and the insulating layer 19 do not need to be actually two separate layers. Next, predefined regions of the insulting layer 19, the planarizing layer 18 and the fluorescent medium layer 12 are etched out. Either dry or wet etching method may be used. The etched-out regions are then filled with one of the conductive materials selected from either metals such as gold, silver, copper and aluminum, or alloys of them. Any methods of physical vapor deposition, chemical vapor deposition, electroplating, electroless plating, or sol-gel may be used, but electroplating and electroless plating techniques are preferred. The filled parts become the partition walls 13 which serve as auxiliary electrode elements as well as a means to physically separate each of the fluorescent media 12 for the purpose of minimizing the color contamination.

The first electrode needs to be electrically conducting as well as light-transmitting. Indium tin oxide, most widely used as the first electrode material, is a reasonably good electrical conductor and light transmitter. But its resistivity is still high compared to metals such as aluminum, copper, silver and gold. The poor conductivity results in the voltage drop, which in turn causes the non-uniform luminance over the panel surface. In the present invention, the conductivity of the first electrode stripes has been dramatically improved using an auxiliary electrode scheme: the partition walls 13 are made of a material with an excellent electrical conductivity and are electrically connected to the first electrode elements 14.

After the formation of the partition walls 13, the insulating layer is further removed to leave unetched only a small part of the layer 19 as seen in FIG. 2. The remaining insulating layer 19 serves as an electrical insulator between one of the first electrode elements and the adjacent partition wall or auxiliary first electrode. To insure the electrical insulation, the remaining insulating layer has a width preferably greater than 100 nm. The first electrode material is then deposited to fill the etched space. The first electrode material deposited on top of the insulating layer 19 and the partition walls 13 is etched out.

An alternative route may be taken:

(1) forming the fluorescent media 12 and the planarizing layer 18;

(2) etching out the predefined regions and fill them with a conductive material to form the partition walls 13;

(3) depositing the first electrode material;

(4) etching out a small part denoted as 19 in FIG. 2;

(5) depositing an insulating material; and, (6) eliminating the insulating material except on the part denoted as 19 in FIG. 2.

A planar electroluminescent layer 15, which typically constitutes of a hole transporting layer, a luminescent layer and an electron transporting layer, is laminated on the first electrode elements 14. Next, the second electrode stripes 16 are formed using a shadow mask. It is possible to fabricate a shadow mask with a high precision using an additive method in which both chemical etching and electroplating are employed. This way of forming second electrode elements is more appropriate for mass productions compared to that described in the related art described earlier. After the formation of a protective layer 17 on the second electrode stripes, the panel is now ready for encapsulation.

As has been explained, the multi-color ELD array panel and a method for fabricating the same have the following advantages.

First, the physical separation of R, G, B fluorescent media from each other by the partition walls helps to minimize the possible color contamination.

Secondly, the electrical conductivity improved by the use of partition walls as the auxiliary electrode insures more uniform luminance.

Finally, the fabrication process of this invention is suitable for mass productions.

It will be apparent to those skilled in the art that various modifications and variations can be made in the multi-color ELD array panel and the method for fabricating the same of the present invention without departing from the spirit or scope of the invention. Thus, it is intended that the present invention cover the modifications and variations of this invention provided they come within the scope of the appended claims and their equivalents.

What is claimed is:

1. A method for fabricating an electroluminescent display array panel, comprising the steps of:
   (1) forming a fluorescent media layer, a planarizing layer and an insulating layer on a transparent support in succession;
   (2) etching out a part of the insulating layer and the underlying planarizing layer and fluorescent media layer, and forming the partition walls therein;
   (3) removing further the insulating layer and forming the first electrode stripes therein;
   (4) forming a planar electroluminescent layer on the first electrode elements; and,
   (5) forming second electrode stripes on the electroluminescent layer and forming a protective layer on the second electrode elements.

2. A method as claimed in claim 1, wherein the planarizing layer has a thickness of 5~1000 nm.

3. A method as claimed in claim 1, wherein the insulating layer has a thickness of 50~200 nm.

4. A method as claimed in claim 1, wherein the partition wall is formed of any one of the materials selected from either metals such as gold, silver, copper and aluminum, or alloys of them.

5. A method as claimed in claim 1, wherein the portion of the insulating layer left at a side of each of the partition walls has a width greater than 100 nm.

6. A method for fabricating an electroluminescent display array panel, comprising the steps of:
   (1) forming a fluorescent media layer and a planarizing layer on a transparent support in succession;
   (2) etching out the planarizing layer and the underlying fluorescent media layer, and forming partition walls therein;
   (3) depositing the first electrode material;
   (4) etching out a part of the first electrode material and forming an insulating layer therein;
   (5) forming a planar electroluminescent layer on the first electrode elements; and,
   (6) forming second electrode stripes on the electroluminescent layer and forming a protective layer on the second electrode elements.

7. A method as claimed in claim 6, wherein the planarizing layer has a thickness of 5~1000 nm.

8. A method as claimed in claim 6, wherein the insulating layer has a thickness of 50~200 nm.

9. A method as claimed in claim 6, wherein the partition wall is formed of any one of the materials selected from either metals such as gold, silver, copper and aluminum, or alloys of them.

10. A method as claimed in claim 6, wherein the portion of the insulating layer left at a side of each of the partition walls has a width greater than 100 nm.

* * * * *